(12) United States Patent
Onodera

(10) Patent No.: US 9,252,476 B2
(45) Date of Patent: Feb. 2, 2016

(54) CIRCUIT MODULE INCLUDING A SPLITTER AND A MOUNTING SUBSTRATE

(71) Applicant: Murata Manufacturing Co., Ltd., Nagaokakyo-shi, Kyoto-fu (JP)

(72) Inventor: Syuichi Onodera, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 42 days.

(21) Appl. No.: 14/057,000

(22) Filed: Oct. 18, 2013

(65) Prior Publication Data

US 2014/0045546 A1 Feb. 13, 2014

Related U.S. Application Data

(63) Continuation of application No. PCT/JP2012/002741, filed on Apr. 20, 2012.

(30) Foreign Application Priority Data

Apr. 21, 2011 (JP) .................................. 2011-095193

(51) Int. Cl.
*H04M 1/02* (2006.01)
*H01P 5/12* (2006.01)
*H03H 9/05* (2006.01)
*H05K 1/02* (2006.01)
*H05K 1/11* (2006.01)

(52) U.S. Cl.
CPC ............... *H01P 5/12* (2013.01); *H03H 9/0566* (2013.01); *H04M 1/0202* (2013.01); *H05K 1/0227* (2013.01); *H05K 1/0233* (2013.01); *H05K 1/0243* (2013.01); *H05K 1/113* (2013.01); *H05K2201/09618* (2013.01); *H05K 2201/1006* (2013.01)

(58) Field of Classification Search
CPC ... H04M 1/0202; H05K 1/0243; H05K 1/113; H05K 2201/09618
USPC ................ 455/550.1; 333/101, 132, 134, 238
See application file for complete search history.

(56) References Cited

U.S. PATENT DOCUMENTS

| | | | |
|---|---|---|---|
| 2003/0174479 A1 | 9/2003 | Shimura et al. | |
| 2010/0319975 A1 | 12/2010 | Tsutsumi et al. | |
| 2011/0221542 A1* | 9/2011 | Kihara | ............................... 333/4 |

FOREIGN PATENT DOCUMENTS

| | | |
|---|---|---|
| JP | 05-014015 A | 1/1993 |
| JP | 07-045746 A | 2/1995 |
| JP | 09-121137 A | 5/1997 |

(Continued)

OTHER PUBLICATIONS

Official Communication issued in International Patent Application No. PCT/JP2012/002741, mailed on Jun. 5, 2012.

*Primary Examiner* — Sam Bhattacharya
(74) *Attorney, Agent, or Firm* — Keating & Bennett, LLP

(57) ABSTRACT

In a circuit module, even if a transmission signal output from a transmission electrode of a mounting substrate to a transmission terminal of a splitter leaks into a ground electrode, the transmission signal that has leaked into the ground electrode flows into via conductors that are connected along an edge portion of the ground electrode close to the transmission electrode and connected to a ground line of a motherboard. Therefore, the transmission signal that has been output from the transmission electrode and leaked into the ground electrode is prevented from traveling along an edge portion of the ground electrode toward a reception electrode side. Thus, characteristics of isolation between the transmission electrode and the reception electrode provided on the mounting substrate on which the splitter is mounted are improved.

21 Claims, 4 Drawing Sheets

(56) References Cited

FOREIGN PATENT DOCUMENTS

| JP | 2000-077954 | A | 3/2000 |
|----|-------------|---|--------|
| JP | 2003-152292 | A | 5/2003 |
| JP | 2003-273277 | A | 9/2003 |
| JP | 2003-298462 | A | 10/2003 |
| JP | 2006-279604 | A | 10/2006 |
| WO | 2009/104251 | A1 | 8/2009 |
| WO | 2010/067497 | A1 | 6/2010 |

* cited by examiner

CIRCUIT MODULE INCLUDING A SPLITTER AND A MOUNTING SUBSTRATE

BACKGROUND OF THE INVENTION

1. Field of the Invention

The present invention relates to circuit modules that include a splitter including a transmission filter and a reception filter with different pass bands from each other.

2. Description of the Related Art

In recent years, mobile communication terminals such as cellular phones and mobile information terminals that support communication using a plurality of communication standards such as the global system for mobile communications (GSM) standard and the code division multiple access (CDMA) standard have rapidly become widespread, and in such mobile communication terminals, transmission and reception of signals of different frequency bands is performed using a common antenna. Therefore, there have been growing demands for there to be further increases in the performance of and reductions in the size of front end modules (circuit modules) such as antenna switches including a splitter (duplexer) that separates a transmission signal and a reception signal having different frequencies from each other.

For example, as illustrated in FIG. 7, a splitter 500, which has a reduced size and increased performance as a result of having first and second filter units 503 and 505 having different signal frequency bands arranged close to each other in such a manner that the characteristics of the filter units 503 and 505 are not degraded, is mounted on a mounting substrate to be included in a circuit module, and as a result, the circuit module can be reduced in size and increased in performance. The splitter 500 of the related art illustrated in FIG. 7 includes the first filter unit 503, which includes a surface acoustic wave (SAW) filter device 502, and the second filter unit 505, which includes a SAW filter device 504, on a mounting surface of a base substrate 501 composed of a resin, a ceramic or a polymer material, such as a printed substrate, an LTCC substrate, an alumina-based substrate, a glass substrate or a composite material substrate, and the first and second filter units 503 and 505 are each provided with passive devices such as chip inductors 506 and chip capacitors 507 that serve as peripheral circuit devices that complement the electrical characteristics of the SAW filter devices 502 and 504.

In order to suppress electromagnetic interference between the inductor devices and prevent signal interference between the filter units 503 and 505, the chip inductors 506, which are arranged so as to be adjacent to each other in a boundary portion 508 between the first filter unit 503 and the second filter unit 505, are arranged on the base substrate 501 such that their magnetic flux directions are substantially orthogonal to each other. By adopting this configuration, even though the filter units 503 and 505 are arranged close to each other, signal interference between the first and second filter units 503 and 505 is prevented and changes in the characteristics of the filter units 503 and 505 are reduced.

The splitter 500 of the related art, for which a reduction in size and an increase in performance have been achieved in this way, is mounted on a mounting substrate and the first and second filter units 503 and 505 of the splitter 500 are respectively utilized as a transmission filter and a reception filter and thereby a circuit module such as an antenna switch is formed.

In addition, the splitter 500 has a transmission terminal for allowing input of a transmission signal from the mounting substrate side to the transmission filter, a reception terminal for allowing output of a reception signal from the reception filter to the mounting substrate side, an antenna terminal (common terminal) that is connected to the output side of the transmission filter and the input side of the reception filter, and a ground terminal. The mounting substrate is provided with a transmission electrode and a reception electrode, which are respectively connected to the transmission terminal and the reception terminal of the splitter 500. Then, a transmission signal is output via the transmission terminal to the transmission filter included in the splitter 500 from the transmission electrode of the mounting substrate and the transmission signal input to the transmission filter is subjected to predetermined filter processing and is then output from the antenna terminal of the splitter 500. In addition, a reception signal is input to the reception filter included in the splitter 500 from the antenna terminal and the reception signal input to the reception filter is subjected to predetermined filter processing and is then output to the mounting substrate side via the reception electrode from the reception terminal of the splitter 500.

There is a risk of a transmission signal, which has been output to the transmission terminal of the splitter 500 from the transmission electrode of the mounting substrate in order to input a transmission signal to the transmission filter, leaking toward the reception electrode, which is provided on the mounting substrate and is for allowing input of a reception signal, and interfering with a reception signal input from the antenna terminal and output to the reception electrode of the mounting substrate from the reception terminal via the reception filter. Therefore, in general, in order to prevent a transmission signal output to the transmission terminal of the splitter 500 from the transmission electrode of the mounting substrate from interfering with a reception signal input from the antenna terminal and output to the reception electrode of the mounting substrate from the reception terminal of the splitter 500 via the reception filter, a ground electrode, which is connected to the ground terminal of the splitter 500, is provided between the transmission electrode and the reception electrode on the mounting substrate.

In recent years, size reduction of mobile communication terminals has been rapidly progressing and there is a demand for further size reduction of a circuit module mounted in a mobile communication device and of the splitter 500 mounted in the circuit module. However, if the splitter 500 is further reduced in size, the spaces between the transmission terminal, which is for allowing input to the transmission filter, and the reception terminal, which is for allowing output from the reception filter, of the splitter 500 become extremely small, and therefore, even though the ground electrode, which is connected to the ground terminal of the splitter 500, is provided between the transmission electrode and the reception electrode provided on the mounting substrate on which the splitter 500 is mounted, there is a risk of a transmission signal output to the transmission terminal of the splitter 500 from the transmission electrode of the mounting substrate leaking into the ground electrode and of the transmission signal that has leaked into the ground electrode traveling along an edge portion of the ground electrode toward the reception electrode side and interfering with a reception signal output to the reception electrode of the mounting substrate from the reception terminal of the splitter 500 via the reception filter. This is an obstacle to size reduction of the splitter 500.

SUMMARY OF THE INVENTION

In view of the above, preferred embodiments of the present invention provide a technology in which characteristics of isolation between a transmission electrode and a reception electrode are improved, the transmission electrode and the reception electrode being provided on a mounting substrate on which a splitter is mounted.

A circuit module according to a preferred embodiment of the present invention includes a splitter including a transmission filter and a reception filter with different pass bands from each other, and a mounting substrate on which the splitter is mounted. The splitter includes a transmission terminal to allow input to the transmission filter, a reception terminal to allow output from the reception filter and a ground terminal. The mounting substrate is provided with a transmission electrode that is connected to the transmission terminal, a reception electrode that is connected to the reception terminal and a ground electrode that is arranged between the transmission electrode and the reception electrode and is connected to the ground terminal. A plurality of via conductors are connected to the ground electrode along an edge portion of the ground electrode that is close to the transmission electrode when viewed in plan.

In addition, it is preferable that the plurality of via conductors be connected to the ground electrode along edge portions of the ground electrode from an edge portion of the ground electrode close to the transmission electrode to an edge portion of the ground electrode close to the reception electrode when viewed in plan. With this configuration, a transmission signal that has been output from the transmission electrode and leaked into the ground electrode more efficiently flows into the plurality of via conductors connected along edge portions of the ground electrode and therefore the transmission signal that has leaked into the ground electrode is more efficiently prevented from traveling along an edge portion of the ground electrode toward the reception electrode side, and therefore the characteristics of isolation of the transmission electrode and the reception electrode from each other is greatly improved, the transmission electrode and the reception electrode being provided on the mounting substrate on which the splitter is mounted.

In addition, the transmission electrode and the reception electrode may be provided adjacent to or in a vicinity of an edge of a mounting surface of the mounting substrate and the ground electrode may be provided between that edge and the transmission electrode when viewed in plan. With this configuration, the circuit module is reduced in size by arranging the splitter close to an edge of the mounting substrate. In addition, since the ground electrode is provided between an edge of the mounting substrate and the transmission electrode when viewed in plan, a transmission signal that has been output from the transmission electrode and has leaked into the ground electrode flows into the plurality of via conductors connected along the edge portions of the ground electrode provided between the edge of the mounting substrate and the transmission electrode, and the transmission signal that has leaked into the ground electrode is prevented from traveling along an edge portion of the ground electrode toward the reception electrode side, and therefore the characteristics of isolation of the transmission electrode and the reception electrode from each other are greatly improved, the transmission electrode and the reception electrode being provided on the mounting substrate.

In addition, the ground electrode may be provided across a plurality of layers in the mounting substrate and individual portions of the ground electrode may be connected to each other with the via conductors. With this configuration, a transmission signal that has been output from the transmission electrode and leaked into the ground electrode more efficiently flows into the plurality of via conductors connected along edge portions of the ground electrode and therefore the transmission signal that has leaked into the ground electrode is more efficiently prevented from traveling along an edge portion of the ground electrode toward the reception electrode side. Therefore, the characteristics of isolation of the transmission electrode and the reception electrode from each other are further improved, the transmission electrode and the reception electrode being provided on the mounting substrate on which the splitter is mounted.

In addition, it is preferable that the ground electrode includes a first extended portion that extends toward an area outside of the splitter when viewed in plan. With this configuration, the distance from the edge portion of the ground electrode near to the transmission electrode to the edge portion of the ground electrode near to the reception electrode along the edge portions of the ground electrode becomes longer, and therefore a transmission signal that has been output from the transmission electrode and leaked into the ground electrode is prevented from traveling along an edge portion of the ground electrode toward the reception electrode side with certainty.

In addition, the ground electrode may further include a second extended portion that extends from an end portion of the first extended portion in at least one of a direction toward the transmission electrode and a direction toward the reception electrode. With this configuration, the distance from the edge portion of the ground electrode near to the transmission electrode to the edge portion of the ground electrode near to the reception electrode along the edge portions of the ground electrode becomes even longer, and therefore a transmission signal that has been output from the transmission electrode and leaked into the ground electrode is prevented from traveling along an edge portion of the ground electrode toward the reception electrode side with even more certainty.

In addition, the ground electrode may surround at least the transmission electrode when viewed in plan. With this configuration, the edge portion of the ground electrode surrounding the transmission electrode and the edge portion of the ground electrode near to the reception electrode are not connected to each other and therefore a transmission signal that has leaked into the ground electrode is prevented from traveling along an edge portion of the ground electrode toward the reception electrode side with certainty.

In addition, at least one of the transmission electrode and the reception electrode may be a rectangular or substantially rectangular land located on the mounting surface of the mounting substrate and the ground electrode may surround at least three sides of the rectangular or substantially rectangular periphery of the transmission electrode or the reception electrode when viewed in plan (Claim 8). With this configuration, the distance from the edge portion of the ground electrode near to the transmission electrode to the edge portion of the ground electrode near to the reception electrode along the edge portions of the ground electrode becomes longer, and therefore a transmission signal that has leaked into the ground electrode is efficiently prevented from traveling along an edge portion of the ground electrode toward the reception electrode side.

In addition, the splitter may further include a common terminal that is connected to an output side of the transmission filter and an input side of the reception filter, the transmission electrode, the reception electrode, and a common electrode, which is connected to the common terminal, may be rectangular or substantially rectangular lands on the mounting surface of the mounting substrate, and the ground electrode may surround at least three sides of the transmission electrode, the reception electrode and the common electrode when viewed in plan. With this configuration, as well as a transmission signal that has been output from the transmission electrode and leaked into the ground electrode efficiently flowing into the via conductors connected along edge portions of the ground electrode which surround at least three sides of the transmission electrode, the distance along the edge portions of the ground electrode from the edge portion of the ground electrode close to the transmission electrode to the edge portion of the ground electrode close to the reception electrode becomes longer and therefore a transmission signal that has leaked into the ground electrode is prevented from traveling along an edge portion of the ground electrode toward the reception electrode side with certainty.

According to various preferred embodiments of the present invention, even if a transmission signal output from a transmission electrode of a mounting substrate to a transmission terminal of a splitter leaks into a ground electrode, the transmission signal that has leaked into the ground electrode flows into via conductors that are connected along an edge portion of the ground electrode close to the transmission electrode and therefore the transmission signal that has been output from the transmission electrode and leaked into the ground electrode is prevented from traveling along an edge portion of the ground electrode toward the reception electrode side and therefore the characteristics of isolation of the transmission electrode and the reception electrode from each other are greatly improved, the transmission electrode and the reception electrode being provided on the mounting substrate on which the splitter is mounted.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
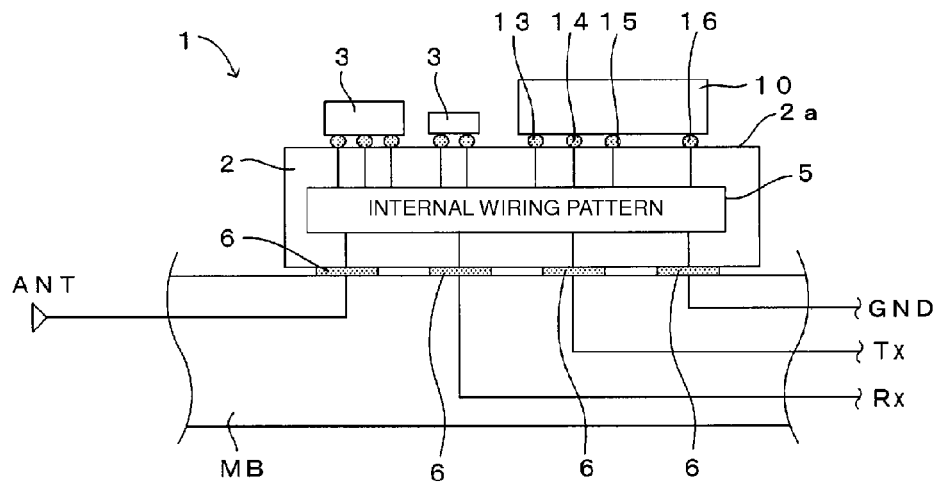
FIG. 1 illustrates a first preferred embodiment of a circuit module of the present invention.
Figure 2:
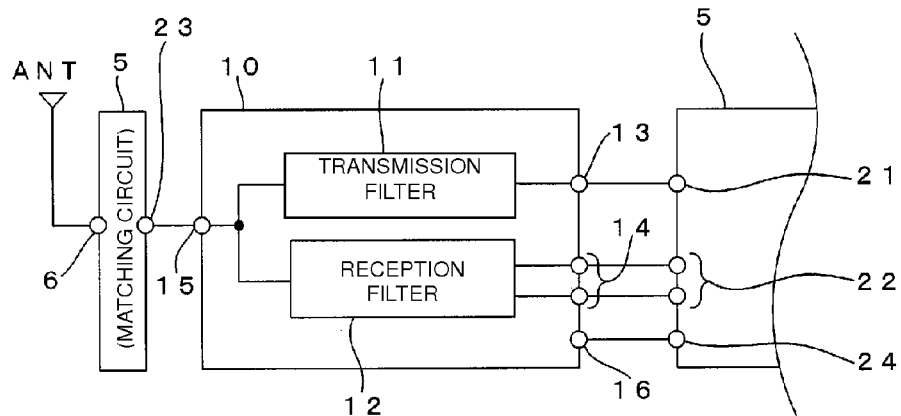
FIG. 2 is a block diagram illustrating the internal configuration of the circuit module of FIG. 1.
Figure 3:
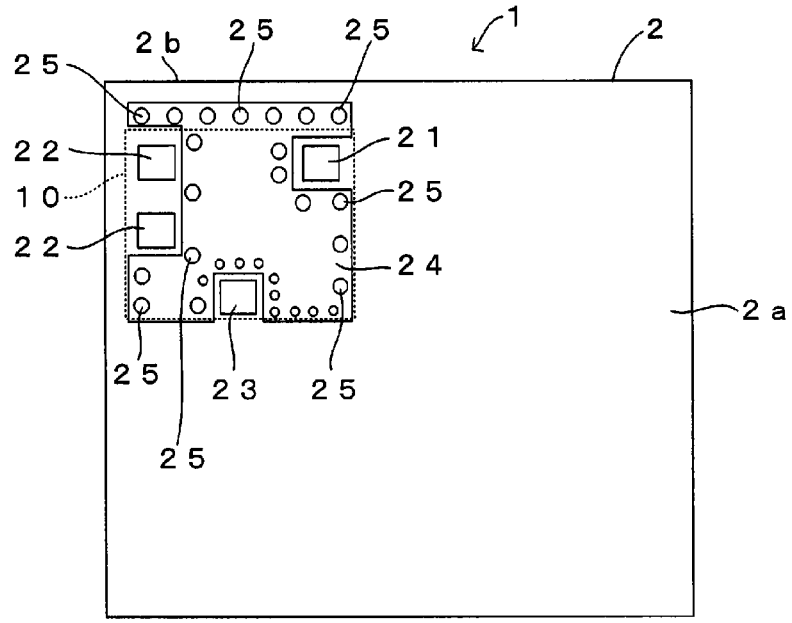
FIG. 3 is a plan view illustrating an example of the shapes of electrodes of a mounting substrate.

Description will be given of a first preferred embodiment of a circuit module that includes a splitter (duplexer) of the present invention while referring to FIGS. 1 to 3. FIG. 1 illustrates the first preferred embodiment of the circuit module of the present invention. FIG. 2 is a block diagram illustrating the internal configuration of the circuit module of FIG. 1. FIG. 3 is a plan view illustrating an example of the shapes of electrodes of a mounting substrate.

A circuit module 1 illustrated in FIG. 1 is mounted on a motherboard MB included in a mobile communication terminal such as a cellular phone or a mobile information terminal, and, in this preferred embodiment, includes a mounting substrate 2, a splitter 10, and various components 3 such as a switch IC, a filter, a resistor, a capacitor and a coil, and preferably is a high-frequency antenna switch module, for example. In addition, the splitter 10 and the components 3 are mounted on electrodes provided on a mounting surface 2a of the mounting substrate 2 and are electrically connected to a plurality of mounting electrodes 6 located on a back surface of the mounting substrate 2 via an internal wiring pattern 5 provided inside the mounting substrate 2. The circuit module 1 is mounted on the motherboard MB such that the circuit module 1 is connected to various signal lines that the motherboard MB is equipped with such as an antenna line ANT, a ground line GND, a transmission signal line Tx and a reception signal line Rx, and a power supply line, and input and output of transmission and reception signals between the motherboard MB and the circuit module 1 is performed.

The mounting substrate 2, in this preferred embodiment, preferably is an integrated ceramic multilayer body formed by stacking a plurality of dielectric layers defined by ceramic green sheets on top of one another and then firing the stacked dielectric layers. The internal wiring pattern 5 is preferably provided by appropriately forming via conductors and electrode patterns in and on the dielectric layers.

That is, the ceramic green sheets that define the dielectric layers are fabricated by making a slurry, which is obtained by mixing a mixed powder of, for example, alumina and glass with an organic binder, a solvent and so forth, into sheets with a film formation apparatus and are formed so as to be capable of being subjected to so-called low-temperature firing, that is, at a low temperature of around 1000° C., for example. The dielectric layers are preferably formed by forming via conductors to provide connections between the layers by forming, by, for example, laser processing, via holes in the ceramic green sheets, which have been cut into a predetermined shape, filling the formed via holes with a conductive paste including for example Ag or Cu, and performing via fill plating, and forming various electrode patterns by printing a conductive paste.

The internal wiring pattern 5 is preferably formed by providing electrode patterns and via conductors on and in the dielectric layers, the electrode patterns and the via conductors to electrically connect the splitter 10 and the various components 3, which are mounted in the circuit module 1, to the mounting electrodes 6. At this time, circuit elements such as capacitors and coils are formed by the electrode patterns and via conductors that form the internal wiring pattern 5 and a filter circuit and a matching circuit and so forth may be formed by the circuit elements such as capacitors and coils formed by the electrode patterns and via conductors, for example.

The splitter 10 preferably is used to separate transmission signals and reception signals with different frequencies from each other. As illustrated in FIG. 2, the splitter 10 includes a transmission filter 11 and a reception filter 12 with different pass bands for a high-frequency signal. The transmission filter 11 and the reception filter 12 each preferably include a surface acoustic wave (SAW) filter device and in this preferred embodiment, a balanced output type reception filter 12 is preferably provided. Provided that it has function of allowing a signal of a certain band to pass therethrough, any device such as a dielectric filter or a BAW filter device may be used as the transmission filter 11 and the reception filter 12, for example.

In addition, the splitter 10 includes a transmission terminal 13 to allow input to the transmission filter 11, reception terminals 14 to allow output from the reception filter 12, a common terminal 15 (antenna terminal) that is connected to the output side of the transmission filter 11 and the input side of the reception filter 12, and a ground terminal 16, and the splitter 10 is connected to a transmission electrode 21, reception electrodes 22, a common electrode 23 and a ground electrode 24 provided on the mounting substrate 2.

In this preferred embodiment, the transmission filter 11 and the reception filter 12 of the splitter 10 preferably are defined by SAW filter devices, but, instead of SAW filter devices, the transmission filter 11 and the reception filter 12 may be defined by connecting, for example, a plurality of resonators and coils together or the transmission filter 11 and the reception filter 12 may be any kind of device such as a dielectric filter or a BAW filter device provided that a transmission signal and a reception signal having different frequencies can be separated with certainty. In addition, it is sufficient that a typical apparatus that includes the transmission filter 11 and the reception filter 12 be adopted as the splitter 10 and since the structure and operation of such an apparatus are widely known, detailed description of the structure and operation of the splitter 10 will be omitted.

Next, with reference to FIG. 3, examples of the shapes of the transmission electrode 21, the reception electrodes 22, the common electrode 23 and the ground electrode 24 provided on the mounting substrate 2 will be described.

As illustrated in FIG. 3, in this preferred embodiment, the transmission electrode 21, the reception electrodes 22 and the common electrode 23 are preferably provided by rectangular or substantially rectangular lands on the mounting surface 2a of the uppermost layer of the plurality of dielectric layers of the mounting substrate 2. In addition, the ground electrode 24 is provided on the surface of a dielectric layer one layer below the dielectric layer including the mounting surface 2a and the ground electrode 24 is arranged between the transmission electrode 21 and the reception electrodes 22 when viewed in plan.

In addition, in this preferred embodiment, the transmission electrode 21 and the reception electrodes 22 are preferably provided in the vicinity of an edge 2b of the mounting surface 2a of the mounting substrate 2 and an end portion of the ground electrode 24 on the edge 2b side extends in both directions along the edge 2b so as to be T-shaped or substantially T-shaped when viewed in plan such that the ground electrode 24 is arranged between the edge 2b and the transmission electrode 21 and the reception electrodes 22. In addition, the ground electrode 24 surrounds three sides of each of the transmission electrode 21, the reception electrodes 22 and the common electrode 23 when viewed in plan. That is, in this preferred embodiment, the ground electrode 24 preferably includes a rectangular or substantially rectangular cut-out portion provided in each of three sides of its rectangular or substantially rectangular shape and the transmission electrode 21, the reception electrodes 22 and the common electrode 23 are arranged in the three rectangular or substantially rectangular cut-out portions provided in the ground electrode 24 when viewed in plan.

In addition, the ground electrode 24 is connected to a mounting electrode 6, which is connected to the ground line GND of the motherboard MB, by being connected to a plurality of via conductors 25 of the internal wiring pattern 5. In this preferred embodiment, in particular, the plurality of via conductors 25 are connected along edge portions of the ground electrode 24 that are close to the transmission electrode 21 when viewed in plan. In addition, in this preferred embodiment, the plurality of via conductors 25 are connected along the edge portions of the ground electrode 24 from an edge portion of the ground electrode 24 that is close to the transmission electrode 21 to an edge portion of the ground electrode 24 close to the reception electrodes 22.

Figure 4:
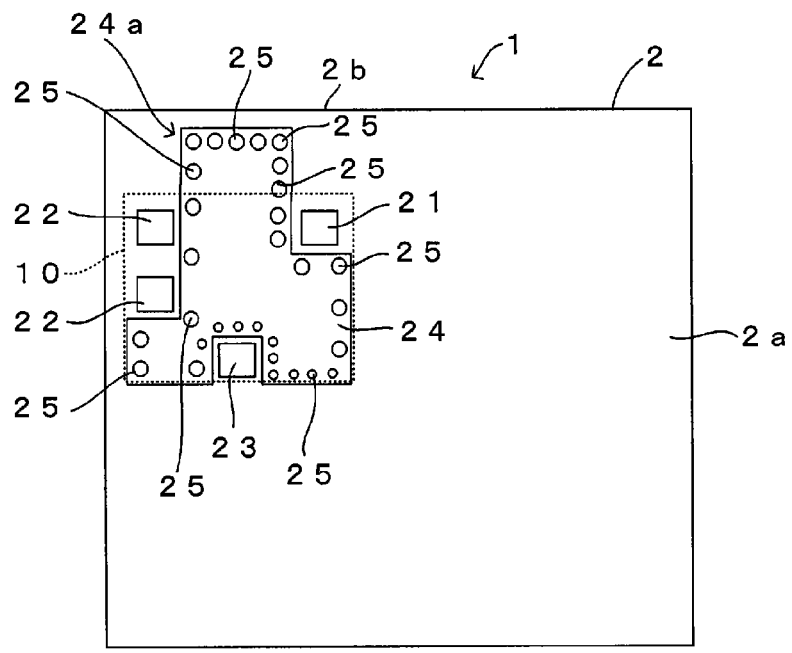
FIG. 4 is a plan view illustrating an example of the shapes of electrodes of a mounting substrate in a second preferred embodiment of the present invention.
Figure 5:
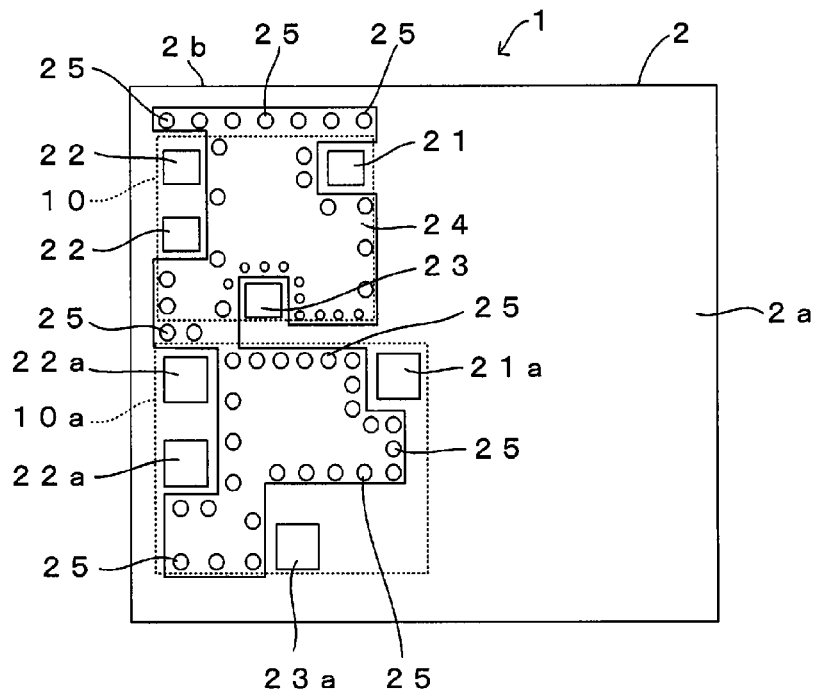
FIG. 5 is a plan view illustrating an example of the shapes of electrodes of a mounting substrate in a third preferred embodiment of the present invention.
Figure 6:
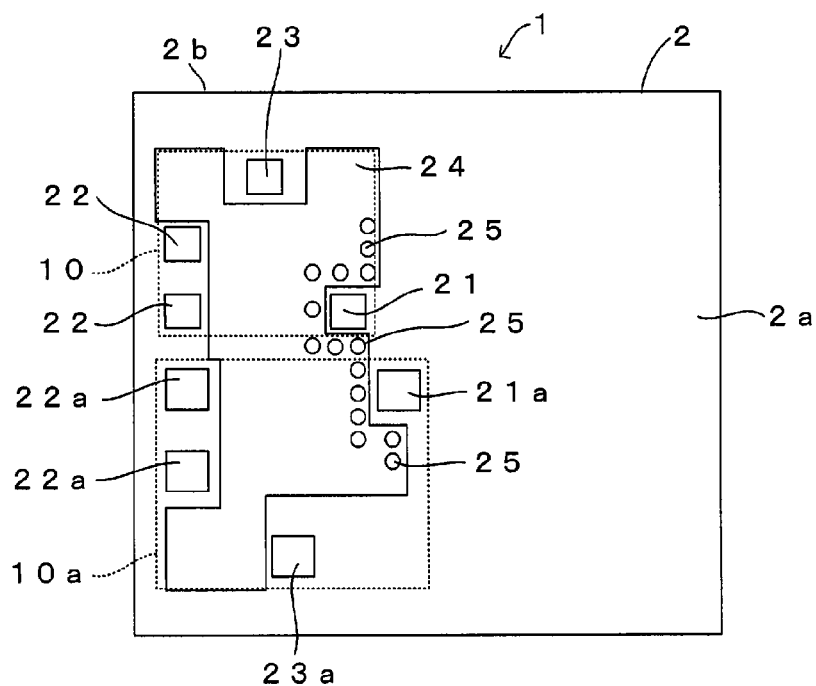
FIG. 6 is a plan view illustrating an example of the shapes of electrodes of a mounting substrate in a fourth preferred embodiment of the present invention.
Figure 7:
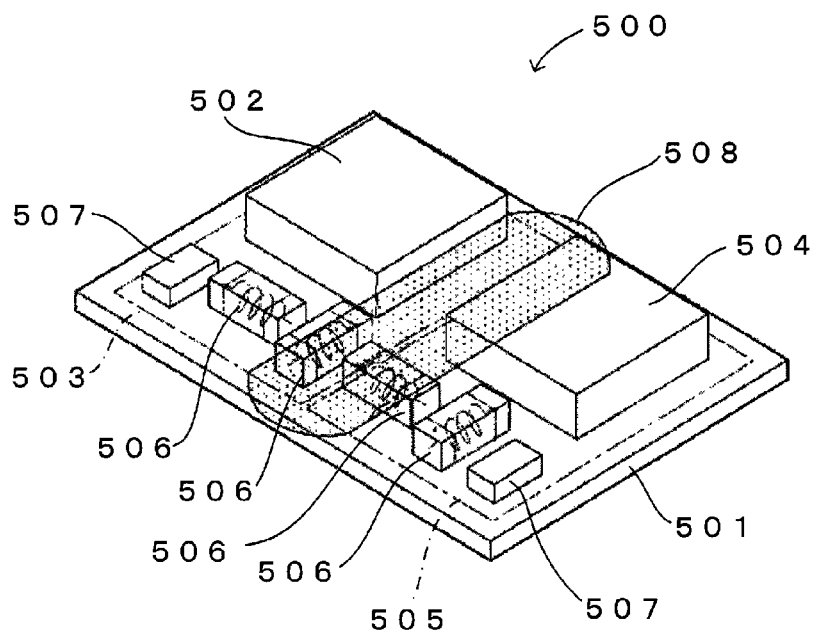
FIG. 7 illustrates an example of a splitter of the related art.

In FIG. 3, for ease of description, only the transmission electrode 21, the reception electrodes 22, the common electrode 23, the ground electrode 24, and the via conductors 25 connected to the ground electrode 24 are illustrated and illustration of other electrodes and via conductors 25 is omitted. In addition, in FIG. 3, the ground electrode 24 and the via conductors 25 provided inside the mounting substrate 2 are illustrated with solid lines, and the mounting position of the splitter 10 on the mounting surface 2a is illustrated with broken lines in the same figure. In addition, the ground terminal 16 of the splitter 10 is connected to a mounting electrode provided on the mounting surface 2a and the ground electrode 24 through a via conductor connected to that electrode (not illustrated). FIGS. 4 to 6 used in description given below show similar illustrations to FIG. 3 and therefore description thereof is omitted hereafter.

Next, an outline of a non-limiting example of a method of manufacturing the circuit module 1 of FIG. 1 will be described.

First, ceramic green sheets for forming the dielectric layers constituting the mounting substrate 2 are prepared as follows. The via conductors 25 to provide connections between layers are formed by forming via holes using, for example, a laser in ceramic green sheets, then filling the insides of the via holes with a conductive paste and then performing via fill plating, then, electrode patterns such as the transmission electrode 21, the reception electrodes 22, the common electrode 23 and the ground electrode 24 are printed using a conductive paste. Electrode patterns such as the via conductors 25, the transmission electrode 21, the reception electrodes 22, the common electrode 23 and the ground electrode 24 are provided on the ceramic green sheets in a plurality in order to make it possible to form a large number of mounting substrates 2 in one go.

Next, the dielectric layers are stacked on top of one another to form a multilayer body. Grooves, which will be used to divide the multilayer body into individual mounting substrates 2 after firing, are formed so as to enclose regions corresponding to the individual mounting substrates 2. Next, an agglomeration of mounting substrates 2 is formed by subjecting the multilayer body to low-temperature firing.

An agglomeration of circuit modules 1 is formed by, prior to dividing the multilayer body into individual mounting substrates 2, mounting splitters 10 and components 3 on the mounting surfaces 2a of the agglomeration of the mounting substrates 2 and providing a molded layer (not illustrated) on each of the mounting substrates 2 by covering the mounting surfaces 2a of the agglomeration of the mounting substrates 2 on which the splitters 10 and the components 3 are mounted with molding resin and thermally curing the molding resin. The circuit modules 1 are completed by dividing the agglomeration of circuit modules 1 into individual pieces.

In the thus-formed circuit module 1, a transmission signal output from the transmission signal line Tx of the mother substrate MB to the transmission terminal 13 of the splitter 10 via a mounting electrode 6 and the internal wiring pattern 5 is input to the transmission filter 11 and subjected to predetermined filter processing, output to the mounting substrate 2 side from the common terminal 15, and output to the antenna line ANT of the motherboard MB via the internal wiring pattern 5 (matching circuit) and a mounting electrode 6. In addition, a reception signal that is input to the common terminal 15 of the splitter 10 from the antenna line ANT of the motherboard MB via a mounting electrode 6 and the internal wiring pattern 5 (matching circuit) is input to the reception filter 12 and subjected to predetermined filter processing, output to the mounting substrate 2 side from the reception terminals 14 and is output to the reception signal line Rx of the motherboard MB via the internal wiring pattern 5 and a mounting electrode 6.

The circuit module 1, which includes the mounting substrate 2, in which the internal wiring pattern 5 is provided, the splitter 10, the components 3 and the molded layer, is not limited to being manufactured by the above-described method and may be formed by any general widely known method, and the mounting substrate 2 can be a printed board, an LTCC, an alumina-based substrate, a glass substrate, a composite material substrate, a single-layer substrate, a multilayer substrate and so on using for example a resin, a ceramic or a polymer material, and the mounting substrate 2 may be formed by choosing the most appropriate material in accordance with the intended use of the circuit module 1, for example.

In addition, in this preferred embodiment, a matching circuit is preferably defined by the internal wiring pattern 5, but a matching circuit may instead include components 3 such as chip coils mounted on the mounting surface 2a of the mounting substrate 2, for example.

As described above, in this preferred embodiment, the splitter 10 includes the transmission terminal 13 that allows input to the transmission filter 11, the reception terminals 14 that allow output from the reception filter 12 and the ground terminal 16, and the transmission electrode 21, which is connected to the transmission terminal 13 of the splitter 10, the reception electrodes 22, which are connected to the reception terminals 14 of the splitter 10, and the ground electrode 24, which is arranged between the transmission electrode 21 and the reception electrodes 22 when viewed in plan and is connected to the ground terminal 16 of the splitter 10, are provided on the mounting substrate 2 on which the splitter 10 is mounted. In addition, a plurality of via conductors 25 are connected to the ground electrode 24 of the mounting substrate 2 along an edge portion of the ground electrode 24 close to the transmission electrode 21 when viewed in plan.

Therefore, even if a transmission signal output from the transmission electrode 21 of the mounting substrate 2 to the transmission terminal 13 of the splitter 10 leaks into the ground electrode 24, since the transmission signal that has leaked into the ground electrode 24 flows into the via conductors 25, which are connected along an edge portion of the ground electrode 24 close to the transmission electrode 21 and are connected to the ground line GND of the motherboard MB, the transmission signal that has been output from the transmission electrode 21 and leaked into the ground electrode 24 is prevented from traveling along an edge portion of the ground electrode 24 toward the reception electrodes 22 side and the transmission electrode 21 and the reception electrodes 22 are prevented from becoming electrically coupled with each other via the transmission signal that has leaked into the ground electrode 24 and therefore, improvement of the characteristics of isolation of the transmission electrode 21 and the reception electrodes 22 from each other is achieved, the transmission electrode 21 and the reception electrodes 22 being provided on the mounting substrate 2 on which the splitter 10 is mounted.

In addition, since the plurality of via conductors 25 preferably are connected to the ground electrode 24 along edge portions of the ground electrode 24 from an edge portion of the ground electrode 24 close to the transmission electrode 21 to an edge portion of the ground electrode 24 close to the reception electrodes 22 when viewed in plan, a transmission signal, which has been output from the transmission electrode 21 and leaked into the ground electrode 24, is more efficiently prevented from traveling along the edge portion of the ground electrode 24 toward the reception electrodes 22 side by more efficiently allowing the transmission signal to flow into the plurality of via conductors 25 that are connected along the edge portions of the ground electrode 24, and therefore the characteristics of isolation of the transmission electrode 21 and the reception electrodes 22 from each other are further improved, the transmission electrode 21 and the reception electrodes 22 being provided on the mounting substrate 2 on which the splitter 10 is mounted.

In addition, the transmission electrodes 21 and the reception electrodes 22 are provided in the vicinity of the edge 2b of the mounting surface 2a of the mounting substrate 2, such that the circuit module 1 is significantly reduced in size by arranging the splitter 10 close to the edge of the mounting substrate 2. However, since the ground electrode 24 is provided between the edge 2b of the mounting substrate 2 and the transmission electrode 21 and the reception electrodes 22 when viewed in plan, a transmission signal that has been output from the transmission electrode 21 and has leaked into the ground electrode 24 flows into the plurality of via conductors 25 connected along the edge portions of the ground electrode 24 provided between the edge 2b of the mounting substrate 2 and the transmission electrode 21, in particular those on the transmission electrode 21 side, and the transmission signal that has leaked into the ground electrode 24 is prevented from traveling along an edge portion of the ground electrode 24 toward the reception electrodes 22 side. As a result, good characteristics of isolation of the transmission electrode 21 and the reception electrodes 22 from each other are maintained even when the space between the transmission electrode 21 and the reception electrodes 22 provided on the mounting substrate 2 has become smaller due to the circuit module 1 being reduced in size.

In addition, since the transmission electrode 21, the reception electrodes 22 and the common electrode 23 are preferably provided by rectangular or substantially rectangular lands on the mounting surface 2a of the substrate 2 and the ground electrode 24 surrounds at least three sides of the transmission electrode 21, the reception electrodes 22 and the common electrode 23 when viewed in plan, since a transmission signal that has been output from the transmission electrode 21 and that has leaked into the ground electrode 24 efficiently flows into the via conductors 25 connected along the edge portion of the ground electrode 24 that surrounds at least three sides of the transmission electrode 21 and the distance from the edge portion of the ground electrode 24 that is close to the transmission electrode 21 to the edge portion of the ground electrode 24 that is close to the reception electrodes 22 when viewed in plan along the edge portions of the ground electrode 24 is long, a transmission signal that has leaked into the ground electrode 24 is prevented with certainty from traveling along an edge portion of the ground electrode 24 toward the reception electrodes 22 side.

Second Preferred Embodiment

Next, a second preferred embodiment of the present invention will be described with reference to FIG. 4. FIG. 4 is a plan view illustrating an example of the shapes of electrodes of a mounting substrate in a second preferred embodiment of the present invention. This preferred embodiment differs from the above-described first preferred embodiment in that, as illustrated in FIG. 4, an extended portion 24a (corresponding to a "first extended portion"), which is provided to as to extend toward the outside of the splitter 10, is provided on the transmission electrode 21 and reception electrodes 22 side of the ground electrode 24 when viewed in plan. Other elements of the configuration are preferably the same as in the first preferred embodiment described above and therefore the same symbols are used and description thereof is omitted.

With this configuration, since the ground electrode 24 includes the extended portion 24a provided so as to extend toward the outside of the splitter 10 when viewed in plan, the distance from the edge portion of the ground electrode 24 near to the transmission electrode 21 to the edge portion of the ground electrode 24 near to the reception electrodes 22 along the edge portions of the ground electrode 24 becomes longer and therefore a transmission signal that has been output from the transmission electrode 21 and leaked into the ground electrode 24 is prevented from traveling along an edge portion of the ground electrode 24 toward the reception electrodes 22 side.

In addition, the extended portion 24a of the ground electrode 24 may also extend in at least one of directions toward the transmission electrode 21 and the reception electrodes 22 from an end portion of the extended portion 24a (corresponding to "second extended portion") such that the ground electrode 24 is arranged so as to be close to at least two sides of the rectangular or substantially rectangular shapes of the transmission electrode 21 or the reception electrodes 22. With this configuration, since the distance from the edge portion of the ground electrode 24 near to the transmission electrode 21 to the edge portion of the ground electrode 24 near to the reception electrodes 22 along the edge portions of the ground electrode 24 when viewed in plan becomes even longer, a transmission signal that has been output from the transmission electrode 21 and leaked into the ground electrode 24 is prevented from traveling along an edge portion of the ground electrode 24 toward the reception electrodes 22 side with even more certainty.

Third Preferred Embodiment

Next, a third preferred embodiment of the present invention will be described with reference to FIG. 5. FIG. 5 is a plan view illustrating an example of the shapes of electrodes of a mounting substrate in the third preferred embodiment of the present invention. This preferred embodiment differs from the above-described first preferred embodiment in that, as illustrated in FIG. 5, two splitters 10 and 10a are mounted on the mounting surface 2a of the mounting substrate 2, a transmission electrode 21a, reception electrodes 22a and a common electrode 23a, on which the splitter 10a is mounted, are further provided on the mounting surface 2a, and the ground electrode 24 is arranged over a large area so as to be located between the transmission electrodes 21 and 21a and the reception electrodes 22 and 22a. Other elements and arrangements of the configuration are preferably the same as in the first preferred embodiment described above and therefore the same symbols are used and description thereof is omitted.

With this configuration, the same advantageous effects as with the above-described first preferred embodiment are attained.

Fourth Preferred Embodiment

Next, a fourth preferred embodiment of the present invention will be described with reference to FIG. 6. FIG. 6 is a plan view illustrating an example of the shapes of electrodes of a mounting substrate in a fourth preferred embodiment of the present invention. This preferred embodiment differs from the above-described third preferred embodiment in that, as illustrated in FIG. 6, the transmission electrode 21 and the reception electrodes 22 that mount the splitter 10 are arranged in a central portion of the ground electrode 24 in the up/down direction in the figure and the common electrode 23 is arranged on the upper edge side of the ground electrode 24. Other elements and arrangements of the configuration are preferably the same as in the third preferred embodiment described above and therefore the same symbols are used and description thereof is omitted. In FIG. 6, only via conductors 25 connected along edge portions of the ground electrode 24 close to the transmission electrodes 21 and 21a are illustrated and illustration of the other via conductors 25 is omitted.

With this configuration, the distance from the edge portion of the ground electrode 24 near to the transmission electrodes 21 and 21a to the edge portion of the ground electrode 24 near to the reception electrodes 22 and 22a along the edge portions of the ground electrode 24 when viewed in plan becomes longer and the same advantageous effects as in the above-described first preferred embodiment are attained.

The present invention is not limited to the above-described preferred embodiments and can be modified in various ways not described above so long as they do not depart from the gist of the present invention. For example, the ground electrode 24 may be arranged across a plurality of dielectric layers of the mounting substrate 2 and the individual portions of the ground electrode 24 may be connected to each other with a plurality of via conductors 25.

With this configuration, since the individual portions of the ground electrode 24, which is provided across a plurality of layers in the mounting substrate 2, are connected to each other with the via conductors 25, transmission signals that have been output from the transmission electrodes 21 and 21a and leaked into the ground electrode 24 more efficiently flow into the plurality of via conductors 25 connected along edge portions of the ground electrode 24 close to the transmission electrodes 21 and 21a when viewed in plan and therefore, a transmission signal that has leaked into the ground electrode 24 can be more efficiently prevented from traveling along an edge portion of the ground electrode 24 toward the reception electrodes 22 and 22a side, and the characteristics of isolation of the transmission electrodes 21 and 21a and the reception electrodes 22 and 22a from each other are even more improved, the transmission electrodes 21 and 21a and the reception electrodes 22 and 22a being provided on the mounting substrate on which the splitters 10 and 10a are mounted.

In addition, the individual portions of the ground electrode 24 provided across a plurality of layers in the mounting substrate 2 may have the same shape, but transmission signals that have been output from the transmission electrodes 21 and 21a and leaked into the ground electrode 24 are efficiently guided into the plurality of via conductors 25 connected along the edge portions of the ground electrode 24 if at least the portions of the ground electrode 24 that are close to the transmission electrodes 21 and 21a have the same shape when viewed in plan.

In addition, the ground electrode 24 may at least surround the transmission electrodes 21 and 21a when viewed in plan. With this configuration, as well as transmission signals that have been output from the transmission electrodes 21 and 21a and leaked into the ground electrode 24 flowing into the via conductors 25 connected along the edge portions of the ground electrode 24 surrounding the transmission electrodes 21 and 21a, the transmission signals that have leaked into the ground electrode 24 are prevented from traveling along an edge portion of the ground electrode 24 toward the reception electrodes 22 and 22a side with certainty since the edge portions of the ground electrode 24 that surround the transmission electrodes 21 and 21a and the edge portions of the ground electrode 24 that are close to the reception electrodes 22 and 22a are not connected to each other.

In addition, it is sufficient that a plurality of via conductors 25 be connected along at least the edge portions of the ground electrode 24 that are close to the transmission electrodes 21 and 21a when viewed in plan and the ground electrode 24 may be provided on the mounting surface 2a of the mounting substrate 2.

In addition, the shapes of the transmission electrodes 21 and 21a, the reception electrodes 22 and 22a and the common electrodes 23 and 23a provided on the mounting surface 2a of the mounting substrate 2 are not limited to being rectangular or substantially rectangular shapes and may be any shape such as a circular or substantially circular shape so long as the splitters 10 and 10a can be mounted, and the ground electrode 24 need not necessarily be arranged so as to surround the rectangular or substantially rectangular shaped transmission electrodes 21 and 21a, reception electrodes 22 and 22a and the common electrodes 23 and 23a from at least three sides.

Preferred embodiments of the present invention can be widely applied to circuit modules that include a splitter including a transmission filter and a reception filter with different pass bands from each other.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit module comprising:
a splitter that includes a transmission filter and a reception filter with different pass bands from each other; and
a mounting substrate on which the splitter is mounted; wherein
the splitter includes a transmission terminal that allows input to the transmission filter, a reception terminal that allows output from the reception filter, and a ground terminal;
the mounting substrate includes a transmission electrode that is connected to the transmission terminal, a reception electrode that is connected to the reception terminal, and a ground electrode that is arranged between the transmission electrode and the reception electrode when viewed in plan and is connected to the ground terminal;
a plurality of via conductors are connected to the ground electrode along an edge portion of the ground electrode that is close to the transmission electrode when viewed in plan; and
the mounting substrate includes a plurality of dielectric layers, and a layer of the plurality of dielectric layers at which the ground electrode is provided is different from a layer of the plurality of dielectric layers at which the transmission electrode, the reception electrode, and the common electrode are provided.

2. The circuit module according to claim 1, wherein the plurality of via conductors are connected to the ground electrode along edge portions of the ground electrode from an edge portion of the ground electrode close to the transmission electrode to an edge portion of the ground electrode close to the reception electrode when viewed in plan.

3. The circuit module according to claim 1, wherein the transmission electrode and the reception electrode are provided adjacent to or in an area of an edge of a mounting surface of the mounting substrate and the ground electrode is provided between that edge and the transmission electrode when viewed in plan.

4. The circuit module according to claim 1, wherein the ground electrode is provided across a plurality of layers of the mounting substrate and individual portions of the ground electrode are connected to each other through the via conductors.

5. The circuit module according to claim 4, wherein the individual portions of the ground electrode provided across the plurality of layers in the mounting substrate have the same shape.

6. The circuit module according to claim 1, wherein the ground electrode includes a first extended portion that extends towards an outside of the splitter when viewed in plan.

7. The circuit module according to claim 6, wherein the ground electrode further includes a second extended portion that extends from an end portion of the first extended portion in at least one of a direction toward the transmission electrode and a direction toward the reception electrode.

8. The circuit module according to claim 1, wherein the ground electrode surrounds at least the transmission electrode when viewed in plan.

9. The circuit module according to claim 1, wherein at least one of the transmission electrode and the reception electrode includes a rectangular or substantially rectangular land on a mounting surface of the mounting substrate and the ground electrode surrounds at least three sides of the transmission electrode or the reception electrode when viewed in plan.

10. The circuit module according to claim 1, wherein
the splitter includes a common terminal that is connected to an output side of the transmission filter and an input side of the reception filter;
the transmission electrode, the reception electrode, and a common electrode, which is connected to the common terminal, include rectangular or substantially rectangular lands located on the mounting surface of the mounting substrate; and
the ground electrode surrounds at least three sides of each of the transmission electrode, the reception electrode and the common electrode when viewed in plan.

11. The circuit module according to claim 10, wherein a shape of the common electrode is one of rectangular, substantially rectangular, circular and substantially circular.

12. The circuit module according to claim 1, wherein the circuit module is a high-frequency antenna switch module.

13. The circuit module according to claim 1, wherein each of the transmission filter and the reception filter includes at least one of a surface acoustic wave device, a dielectric filer and a bulk acoustic wave device.

14. The circuit module according to claim 1, wherein the splitter is a first splitter, the circuit module including a second splitter mounted on the substrate.

15. The circuit module according to claim 14, wherein the ground electrode is located between the transmission electrodes and the reception electrodes of the first and second splitters.

16. The circuit module according to claim 1, wherein
the splitter includes a common electrode that is connected to an output side of the transmission filter and an input side of the reception filter; and
the transmission electrode and the reception electrode are arranged in a central portion of the ground electrode and the common electrode is arranged on an upper edge side of the ground electrode.

17. The circuit module according to claim 1, wherein a shape of each of the transmission electrode and the reception electrode is one of rectangular, substantially rectangular, circular and substantially circular.

18. A mobile communication terminal comprising the circuit module according to claim 1.

19. A mobile information terminal comprising the circuit module according to claim 1.

20. The circuit module according to claim 1, wherein the transmission electrode and the reception electrode are provided at an uppermost layer of the plurality of dielectric layers, and the layer at which the ground electrode is provided is one layer below the uppermost layer.

21. The circuit module according to claim 1, wherein an end portion of the ground electrode on an edge side thereof extends in both directions along an edge of the mounting substrate so as to be substantially T-shaped, such that the ground electrode is arranged between the edge of the mounting substrate and the transmission and reception electrodes.

* * * * *